US006587520B1

United States Patent
Coene et al.

(10) Patent No.: US 6,587,520 B1
(45) Date of Patent: Jul. 1, 2003

(54) GENERATION OF AMPLITUDE LEVELS FOR A PARTIAL RESPONSE MAXIMUM LIKELIHOOD (PRML) BIT DETECTOR

(75) Inventors: Willem M. J. Coene, Eindhoven (NL); Renatus J. Van Der Vleuten, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/399,600

(22) Filed: Sep. 20, 1999

(30) Foreign Application Priority Data

Sep. 18, 1998 (EP) .............................. 98203146

(51) Int. Cl.[7] ................................ H03D 1/00
(52) U.S. Cl. ...................... 375/341; 375/290
(58) Field of Search .................. 375/224, 242, 375/243, 253, 254, 262, 264, 268, 286, 287, 316, 317, 290, 341

(56) References Cited

U.S. PATENT DOCUMENTS

| 5,113,400 | A | * | 5/1992 | Gould et al. ................ 714/795 |
| 5,588,011 | A | | 12/1996 | Riggle .......................... 371/43 |
| 5,666,370 | A | * | 9/1997 | Ganesan et al. ............ 714/752 |
| 5,764,608 | A | * | 6/1998 | Satomura ..................... 360/32 |
| 5,774,470 | A | * | 6/1998 | Nishiya et al. ............. 714/703 |
| 6,092,230 | A | * | 7/2000 | Wood et al. ................ 714/755 |
| 6,278,748 | B1 | * | 8/2001 | Fu et al. ...................... 341/59 |
| 6,288,992 | B1 | * | 9/2001 | Okumura et al. ........... 369/116 |

OTHER PUBLICATIONS

US 5 588 011 a (C.m. Riggle) Dec. 24, 1996 Dec. 24, 1996 column 1, line 14 –column 15, line 9; B.H. Marcus, P.H. Siegel and J.K. Wolf: "Finite –State Modulation Codes for Data Storage" IEEE Journal On Selected Areas In Communication, vol. 10, No. 1, 1992, pp. 5–37, XP 000462064 New York p. 5, column 1, line 1–p. 37, column 2, last line.

* cited by examiner

Primary Examiner—Tesfaldet Bocure
Assistant Examiner—Pankaj Kumar
(74) Attorney, Agent, or Firm—Michael E. Belk (57) ABSTRACT

Apparatus for deriving from an input information signal (IIS) amplitude values usable as reference levels for finite state machine states. The apparatus includes: conversion apparatus for deriving a digital signal from the IIS; detection apparatus for repeatedly detecting a state from sequences of n subsequent bits in the digital signal; sample value apparatus for deriving sample values from the IIS, one sample value for each sequence of n bits; processing apparatus for processing the sample values belonging to sequences of n bits of the same state, and for carrying out this processing step for all states, to obtain a processed signal value for each state; output apparatus for supplying the processed signal values for each state as the amplitude values; and apparatus to use the amplitude values for the possible states, obtained from a first portion of the IIS, for detecting bits from a second portion of the IIS.

1 Claim, 7 Drawing Sheets

GENERATION OF AMPLITUDE LEVELS FOR A PARTIAL RESPONSE MAXIMUM LIKELIHOOD (PRML) BIT DETECTOR

BACKGROUND OF THE INVENTION

FIELD OF THE INVENTION

The invention relates to the field of digital signal reception and more specifically, to the field of maximum likelihood bit detection in which signal amplitudes in a digital signal are used to determine the most likely bit signal.

The invention relates to an apparatus for deriving amplitude values from an input information signal, which amplitude values can be used as reference levels for the states of a finite state machine, which are needed for the computation of the likelihood functional in a partial response maximum likelihood (PRML) bit detection apparatus. The PRML bit detection apparatus is based on a finite state machine with states corresponding to specific bit sequences.

PRML detection requires reference amplitude-levels for each state in the corresponding finite-state-machine (FSM), from which the likelihood of different paths is computed, given the measured signal waveform. The well-known Viterbi-algorithm enables very efficient computation of the most likely path. Each state of an n-taps partial response (PR) corresponds with one of the possible n-bits environments as shown e.g. in FIGS. 3 and 4. In standard PRML detection, an equaliser setting is chosen so that a simple symmetrical partial response is realised in the nominal situation of zero tilt of the disc with respect to the laser beam, i.e. with simple integer-valued coefficients.

Those skilled in the art are directed to Van Den Eden, International Patent Application (PCT) filed under nr. IB97/01532, 1997; and WO/ 97/29485.

The above citations are hereby incorporated in whole by reference.

SUMMARY OF THE INVENTION

A single equaliser may not be optimal in terms of timing recovery. In such case a solution with two equalisers can be implemented, with one equaliser for the timing recovery, and a second one to equalise to the partial response levels. The second one may be made adaptive so that channel fluctuations may be followed, if a robust control mechanism can be set-up, e.g. one that measures the obliqueness of the channel, e.g. from the eye-pattern, and transforms this into an adaptation of the tap-values of the equaliser. Non-linearities such as a systematic asymmetry between marks and non-marks are also a problem to be dealt with and are not accounted for in standard PRML using a linear partial response.

In accordance with the invention, the apparatus for deriving amplitude values from an input information signal, which amplitude values can be used in a partial response maximum likelihood bit detection apparatus, comprises input means (1) for receiving the input information signal, conversion means (2',6) for deriving a digital signal from said input information signal, said digital signal comprising an array of bits of a first or a second binary value occurring at bit instants with a specified bit frequency, detection means (8) for repeatedly detecting a state from subsequent sequences of n subsequent bits in said digital signal, said subsequent sequences being obtained by shifting a time window of n subsequent bits each time over one bit in time, sample value determining means (2) for deriving sample values from said input information signal, one sample value for each of said sequences of n bits, said one sample value for a sequence of n bits corresponding to the signal value of said input information signal at a predetermined time instant lying within a time window corresponding to said sequence of n bits, processing means (4,12) for processing the sample values belonging to sequences of n bits of the same state, and for carrying out this processing step for all states, so as to obtain a processed signal value for each state, output means (20) for supplying the processed signal values for each state as the amplitude values that can be used in the partial response maximum likelihood bit detection apparatus.

The invention is based on the following recognition. With the apparatus in accordance with the invention accommodated in a PRML bit detection apparatus, in fact, a 2-stage process has been realised. In a first stage, a relatively simple bit detector, such as a simple threshold detector (TD), or a threshold detector that corrects for runlength constraint violations—also called: full-response maximum likelihood (FRML) detector, also known as runlength pushback detector, is used to derive bit decisions for a limited range of bits, which are further treated as a training sequence. The data of the training sequence is not a priori known, but is supposed to be well approximated by the result of TD or FRML. An implementation with a digital phase locked loop (PLL) and equaliser will be assumed. Thus, from the asynchronously oversampled signal waveform the bit-synchronously resampled waveform (BSW) for a bit-window of N samples is derived. The latter represents a walk through the finite-state machine (FSM) with step-size equal to the bit-tap, and the actual states that are visited are derived from the bit-environments obtained from TD or FRML. For each state, the measured waveforms corresponding to that state are averaged, yielding the amplitude reference level to be used in the PRML detector, which is the second stage. The walk through the FSM is error free in the case of the FRML bit decisions, but may be subject to some errors when the TD is used for deriving the training sequence.

Those skilled in the art will understand the invention and additional objects and advantages of the invention by studying the description of preferred embodiments below with reference to the following drawings which illustrate the features of the appended claims:

BRIEF DESCRIPTION OF THE DRAWINGS

These and other aspects of the invention will become apparent from and will be elucidated further in the following figure description, in which.

DETAILED DESCRIPTION OF THE PREFERRED EMBODIMENT

Figure 1:
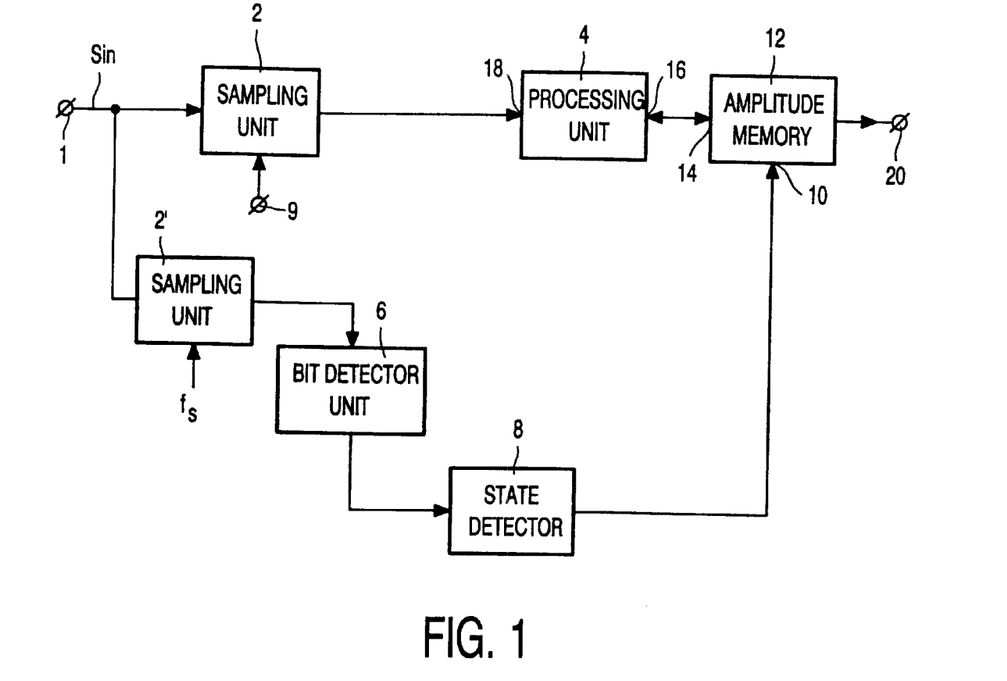
FIG. 1 shows a first embodiment of the apparatus for deriving the amplitude values for a partial response maximum likelihood bit detection apparatus.
Figure 2:
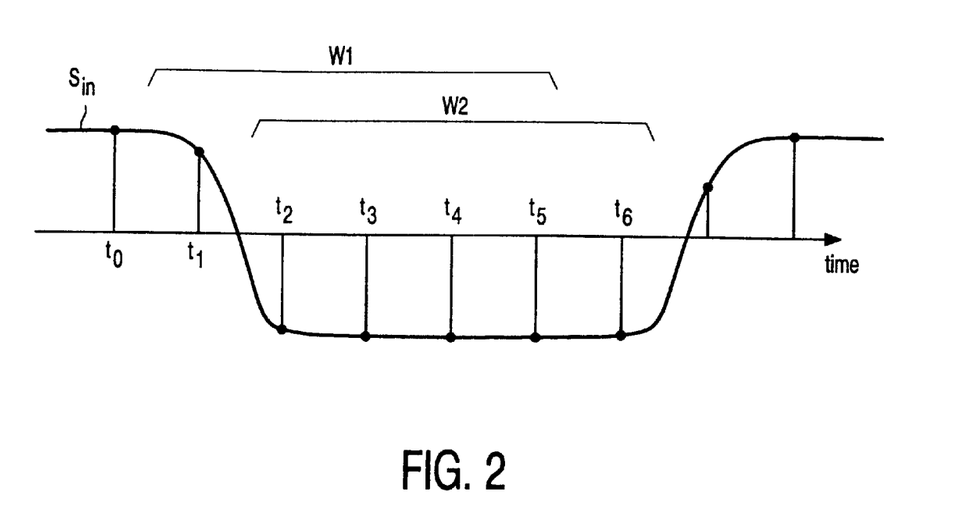
FIG. 2 shows the input information signal and the signal samples at the sampling instants.

FIG. 1 shows an embodiment of the apparatus for deriving amplitude values from an input information signal, which amplitude values can be used as reference levels for the states of a finite state machine, which are needed for the computation of the likelihood functional in a partial response maximum likelihood bit detection apparatus. The amplitude deriving apparatus comprises an input terminal 1 for receiving the input information signal $S_{in}$. The input information signal is a channel encoded information signal read from a record carrier (output current in the photo detectors). The input information signal $S_{in}$ is shown in FIG. 2, and can be an analogue signal, or an oversampled digital signal. The input terminal 1 is coupled to a sampling unit 2' for sampling the signal value of the input information signal at sampling instants, given by a sampling frequency $f_s$, at substantially the exact bit positions in the input information signal. The sampling unit 2' is a sample rate converter in the case $S_{in}$ is an oversampled digital signal. FIG. 2 shows the samples obtained by the sampling unit 2'. An output of the sampling unit 2' is coupled to an input of a bit detector unit 6. The bit detector unit 6 is adapted to convert a sample value at a sampling instant into a digital signal of either a first binary value or a second binary value. In the present embodiment, the bit detector unit 6 is in the form of a threshold detector, and these first and second binary values are the values +1 and −1, respectively. As a result, a sequence of binary values +1 and −1 appear at the output of the bit detector unit 6. The output of the bit detector unit 6 is coupled to an input of a state detector unit 8.

In a preferred embodiment of the bit detector unit 6, the bit detector unit 6 is in the form of a threshold detector with in addition a correction for runlength violations in its output signal. Such detector unit is also called a full response maximum likelihood (FRML) detector, and is well known in the art.

Figure 3:
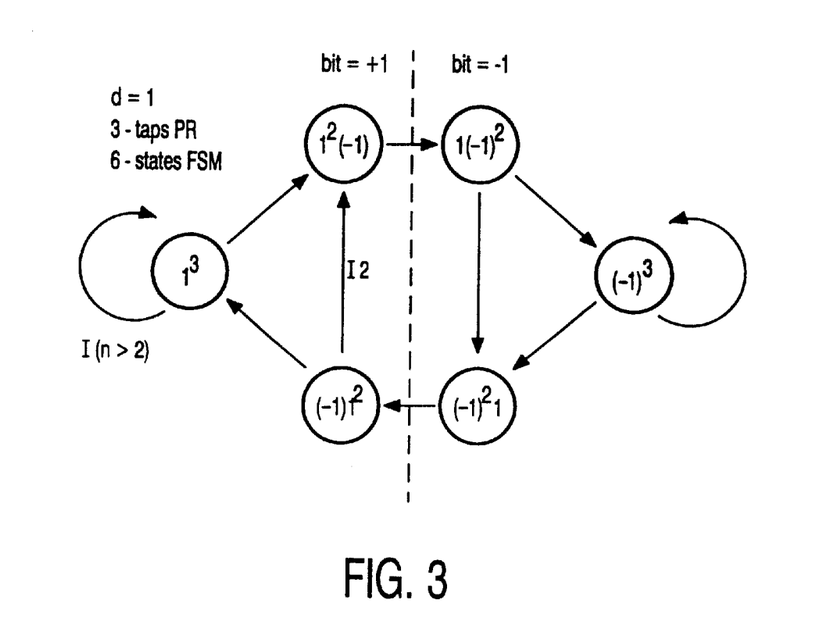
FIG. 3 shows a finite-state diagram of a 3-taps state detector for a d=1 channel code.
Figure 4:
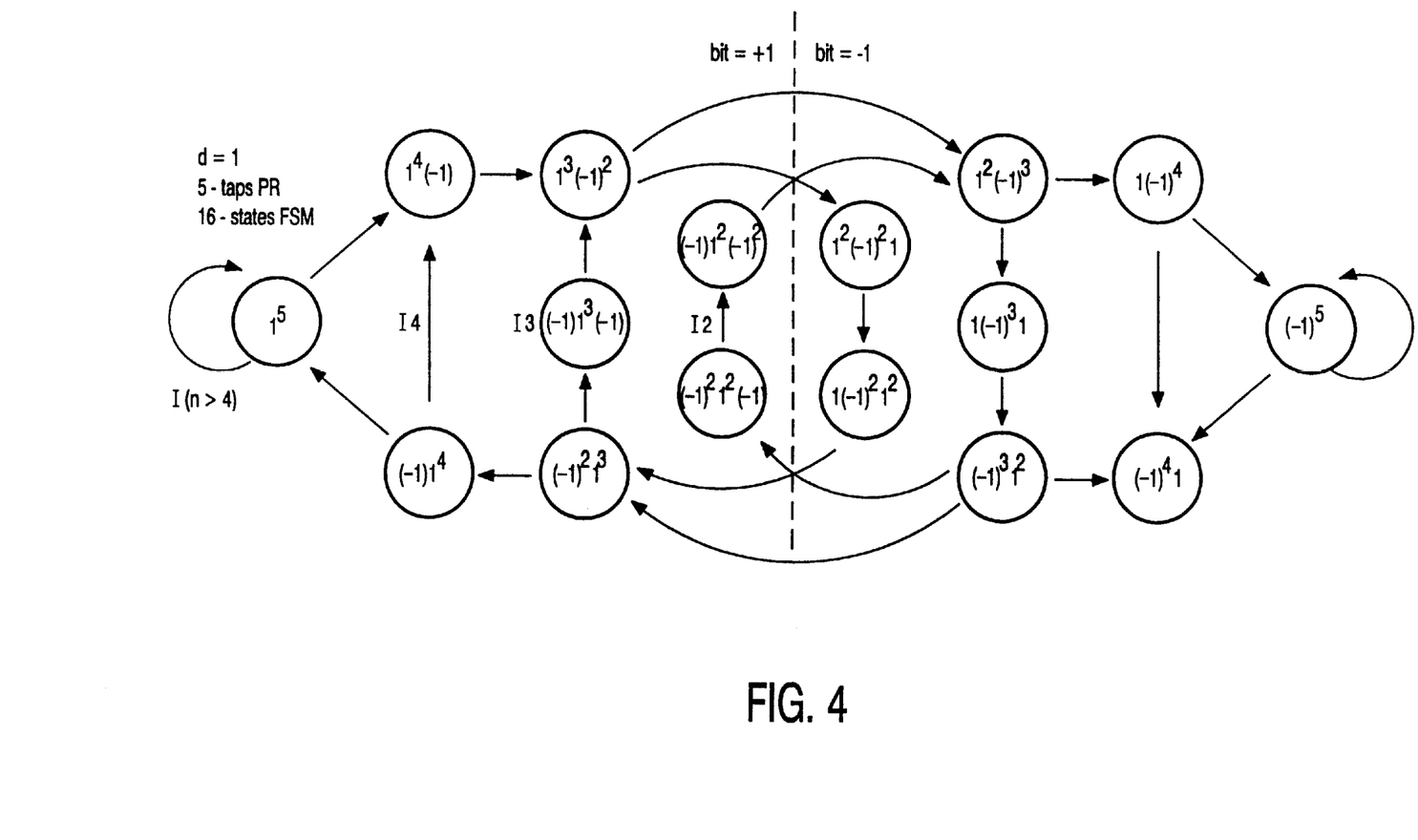
FIG. 4 shows a finite-state diagram of a 5-taps state detector for a d=1 channel code.

The state detector unit 8 is adapted to detect the state of n subsequent binary values in the output signal of the bit detector unit 6. FIG. 3 shows for a channel encoded information signal with a d constraint equal to 1, the finite state diagram, with n equal to 3. FIG. 4 shows for a channel encoded information signal with a d constraint equal to 1, the finite state diagram, with n equal to 5. FIG. 2 shows two time windows $w_1$ and $w_2$ for deriving two subsequent sequences of (n=) 5 subsequent binary values. As can be seen from FIG. 2, the window $w_1$ results in the binary sequence +1,−1,−1,−1,−1, denoted $1(-1)^4$ in the state diagram of FIG. 4, and the window $w_2$ results in the binary sequence −1,−1,−1,−1,−1, denoted $(-1)^5$ in FIG. 4.

The apparatus further comprises a sampling unit 2 for sampling the input information signal at specific time instants, under the influence of a sampling control signal supplied via a sampling input 9 to the unit 2, so as to obtain sample values. In fact, one sample value for each of the time windows shown in FIG. 2 is needed. A sample value for one window corresponds to the signal amplitude of the input information signal for a time instant lying in said window. More specifically, in the present example, the sample value for one window corresponds to the signal amplitude of the input information signal at a time instant lying exactly in the middle of the time window. In the examples shown, where n is an odd number, this corresponds to the time instant when the central bit in a window occurs. Looking at FIG. 2, it can be seen that the sample value corresponding to the window $w_1$ is the signal amplitude at the sampling instant $t_3$, as the sampling instant $t_3$ is the central sample in the 5 sample sequence of the window $w_1$. Equivalently, the sample value corresponding to the window $w_2$ is the signal value at the sampling instant $t_4$.

For n is an even number, and the sample value corresponding to a window again being taken from the input information signal at a time instant lying in the middle of the time window, the sample value now equals the signal amplitude of the input information signal at a time instant exactly half way between the two central bits in the window.

It will be clear that for n is an odd number, the sampling unit 2 and the sampling unit 2' could have been the same sampling unit.

The apparatus further comprises a processing unit 4, which has an input 18 coupled to the output of the sampling unit 2 and further has a connection with an amplitude memory 12.

The state detector unit 8 supplies an identification signal, identifying each of the possible states (6 in the state diagram of FIG. 3, for n=3, and 16 in the state diagram of FIG. 4, for n=5), and supplies the identification signal to a control input 10 of the amplitude memory unit 12. The identification signal supplied by the state detector unit 8 is used in the memory as an address signal, so that an amplitude value stored in the memory 12, at a location corresponding to a state is addressed, and comes available at the input/output 14 terminal of the memory 12. In case of an n-bit sequence that does not comply with the d-constraint, as is possible with a threshold detector, the state detector gives an identification signal that will lead to no action at all. The memory 12 comprises for each of the possible states a value AV as well as a value i for that state. Upon receiving an address corresponding to a state, the corresponding AV value and the value i are retrieved from the memory 12 and supplied to the terminal 16 of the processing unit 4. In a first embodiment of the processing unit 4, the processing unit 4 carries out for each state an averaging step on the sample values generated by the sampling unit 2 for the corresponding state. Such averaging can be realised by carrying out the following calculation:

$$AV_{new}=(AV_{old}*(i-1)+a_i)/i$$

where $a_i$ is the i-th sample value corresponding to the said state, supplied by the sampling unit 2, since the start of the process, $AV_{old}$ is the AV value stored in the memory 12 at the moment of occurrence of the i-th sample value for said state, and $AV_{new}$ is the new AV value stored in the memory 12 for that said, with the sample value as having been taken into account. Thus, after having carried out the above calculation, the memory 12 stores the result $AV_{new}$ as the new value AV in the memory at the location corresponding to the state. Further, i is increased by one, and stored as well in the memory for that state.

Thus, in the process of generating the average values AV for each of the states, the generation process is started by filling the memory unit 12 with start values AV for each of the states. The start values can be taken equal to zero. Further, the memory is filled with i values for each of the states. In the above example, where start values equal to zero are stored in the memory 12, the i values for each of the states will also be chosen equal to zero. The calculation process for one state will be followed hereafter, for a number of detections of occurrence of that state.

Upon the first occurrence of the state, which results in a specific sample value $a_1$, the calculation is:

$$AV_{new}=(0*0+a_1)/1=a_1$$

The result of the calculation is stored as the new value AV in the memory 12, as well as the value i=1.

Upon the second occurrence of the state, which results in a sample value $a_2$, the calculation is $$AV_{new}=(a_1*1+a_2)/2=(a_1+a_2)/2$$

The result of the calculation is stored as the new value AV in the memory, as well as the value i=2. Upon the next occurrence of the state, which results in a specific sample value $a_3$, the calculation is:

$$AV_{new}=[\{(a_1+a_2)/2\}*2+a_3]/3=(a_1+a_2+a_3)/3.$$

The result of the calculation is stored as the new value AV in the memory, as well as the value i=3.

In the end, upon I occurrences of the state, the calculation carried out is equivalent to $$AV_{new}=(a_1+a_2+a_3+a_4+\ldots+a_I)/I.$$

An alternative for the above formula is the implementation of a running average computation given by:

$$AV_{new}=AV_{old}\cdot\alpha+a_1(1-\alpha) \text{ where } \tfrac{1}{2}<\alpha<1.$$

The apparatus is further provided with an output terminal 20 for supplying the average signal values for each possible sequence of n binary values and stored in the memory 12, as the amplitude values that can be used in the partial response maximum likelihood bit detection apparatus.

Figure 1A:
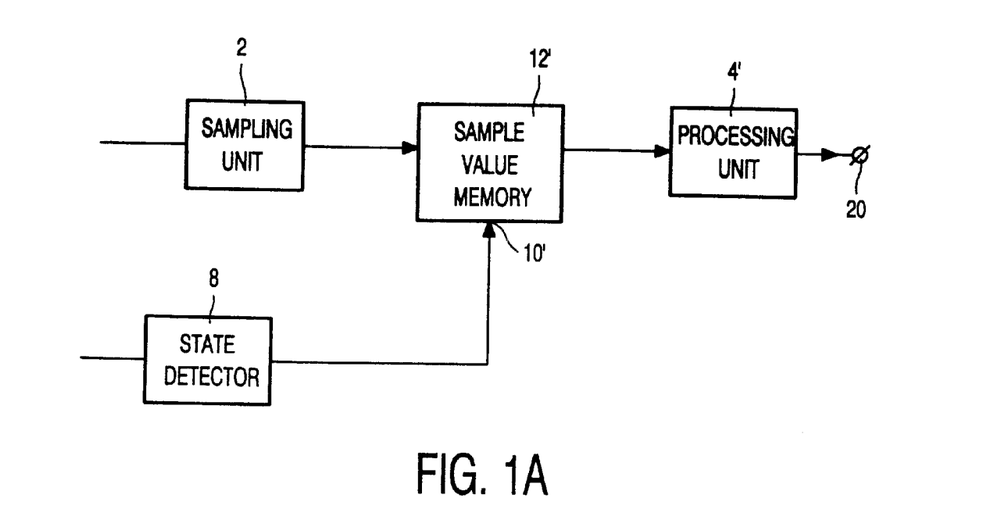
FIG. 1a shows part of a second embodiment of the apparatus.

In another embodiment of the processing unit 4, the processing unit is adapted to determine the median of the sample values $a_1$ to $a_I$ given above. In an apparatus for deriving amplitude values, provided with such processing unit 4, the circuit construction is a little bit different, see FIG. 1a, which shows only the relevant parts of the apparatus. Now, the output of the sampling unit 2 is coupled to the input of a 'sample value memory 12 to store all sample a values belonging to each of the states in the memory 12', in response to the state identification signal supplied by the state detector 8 to the control input 10' of the memory 12'. The processing unit 4' now has an input coupled to the output of the memory 12' and an output coupled to the output terminal 20 of the apparatus. At the end of the detection process, all the sample values belonging to one of the states are supplied by the memory 12' to the processing unit 4' in which the median value of all the sample values is taken as the amplitude value for that state. This is carried out for all of the possible states so as to obtain the amplitude values for all of the states. In an alternative method, the median is taken from the last k sample values, where k is an integer larger than 1.

Figure 5:
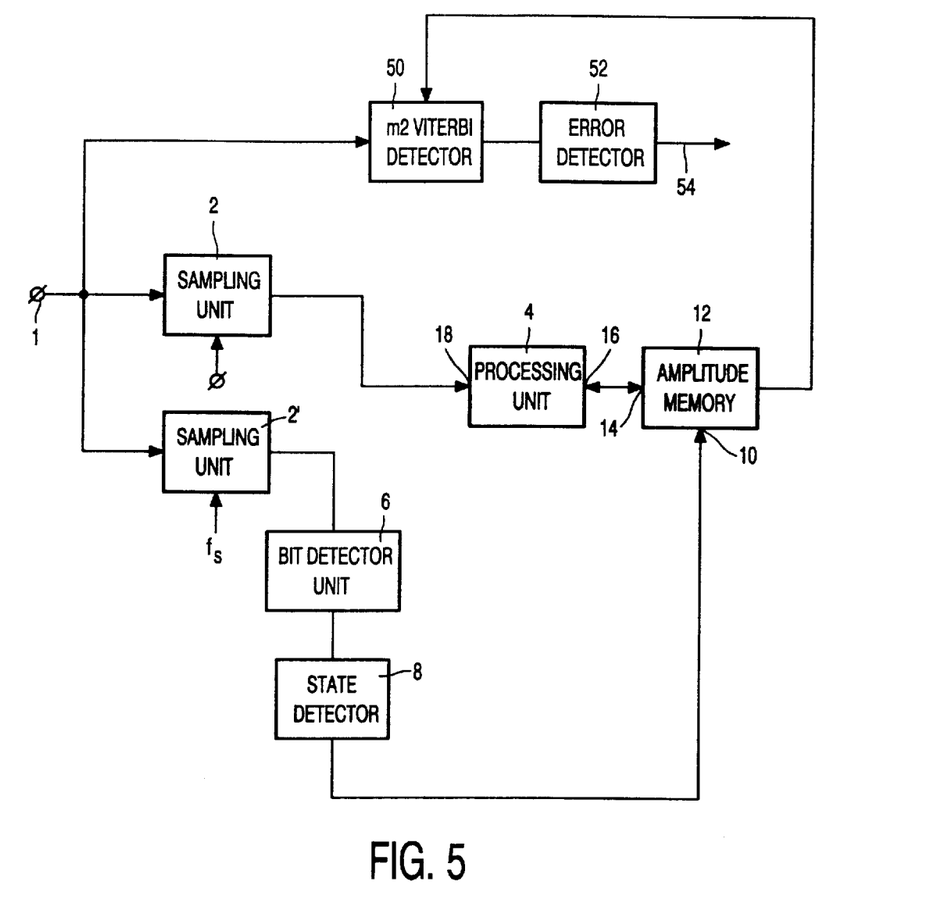
FIG. 5 shows the apparatus of FIG. 1 incorporated in a partial response maximum likelihood bit detection (PRML) apparatus.

FIG. 5 shows the apparatus of FIG. 1 incorporated in a partial response maximum likelihood bit detection (PRML) apparatus, which PRML apparatus comprises a Viterbi detector 50, or any suboptimal maximum likelihood detector, for detecting the sequence of bits from the input information signal and an error detector 52 for detecting errors in the sequence of bits generated by the Viterbi detector 50. The error detector 52 could also include error correction means for correcting errors in the sequence of bits generated by the Viterbi detector 50.

Figure 5A:
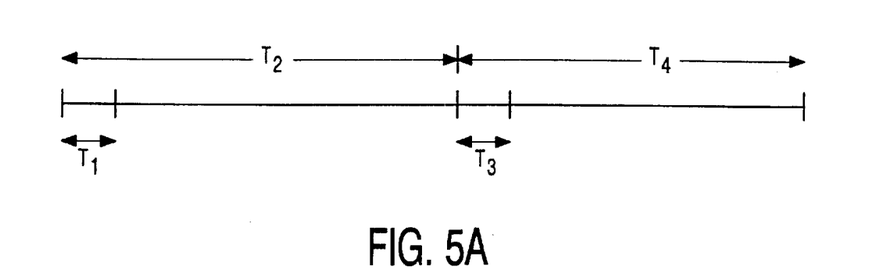
FIG. 5a shows portions of the input information signal from which the amplitude values have been derived.

In the normal functioning of the apparatus for generating the amplitude values, a portion of the input information signal indicated by $T_1$ is used as the training sequence to derive the amplitude values for the PRML detector, see FIG. 5a. The PRML detector generates a binary signal from a portion of the input information signal indicated by $T_2$, using the amplitude values obtained from the portion $T_1$. Next, the apparatus for generating the amplitude values derives new amplitude values from the portion of the input signal indicated by $T_3$, which may be of the same length as the portion $T_1$. Next, the PRML detector generates a binary signal from the portion $T_4$, using either the amplitude values obtained from the portion $T_3$, or using weighted values of the amplitudes obtained from the present portion $T_3$ and obtained from one or more of the previous portions.

The error detector 52 decides whether the sequence of bits generated by the Viterbi detector 50 and obtained from a portion, such as one of the portions $T_2$ or $T_4$, comprise too many errors. In such case, it generates a detection signal on the line 54, which detection signal is supplied to the apparatus for generating the amplitude values, via the line 54.

Suppose that a detection signal is generated by detector 52 for the portion $T_4$, the PRML detector can decide not to use the amplitude values obtained from the portion $T_3$ in its detection algorithm, and use the older values instead.

Advantages of the measure of PRML amplitude retrieval are:

equalisation is optimised for timing recovery, and not for the generation of precise amplitude levels in PRML (as would be done in the standard PRML approach with a single equaliser).

non-linearities in the channel are easily accounted for, since their effect is present in the amplitude levels derived from the "training" sequence.

differences in the quality of written marks (e.g. on different recorders) can be followed.

channel fluctuations can be followed by adaptation control of the amplitude levels (which is a more direct and robust solution than a second equaliser might be in the standard PRML approach).

computation of the likelihood functional is done by a simple subtraction, in the case of an $L_1$-norm (absolute value of the amplitude difference), no multiplications are involved, as is the case for a standard PRML implementation.

the effect of channel errors on the amplitude retrieval is reduced by using the FRML-detected bitstream as input, rather than the TD-detected one.

Next, a PRML detector with reduced complexity will be described. Partial-Response Maximum-Likelihood (PRML) detection is a candidate to replace the standard technique of Threshold Detection (TD) as used in CD and DVD-like systems. For the new DVR (digital video recorder) system, which is an optical recording/reproduction system, where a d=1 channel code is used, a 3-taps PRML detector has been proposed. Investigations have shown that an increase in the number of taps yields a markedly improved performance in terms of the bit-error-rate (BER). However, this implies also an increase in complexity of the Viterbi-trellis, which is linearly dependent on the number of states in the finite-state-machine (FSM) that is used for a n+1-taps PRML. The number of states $N_s$ amounts to 2 times $N_{d=1}(n)$ with $N_{d=1}(n)$ the Fibonacci numbers, i.e. the number of sequences of length n for a d=1 constraint.

The number of states ($N_s$) and branches ($N_B$) for some choices of the number of taps are shown in Table 1. The main drawback of using a 5-taps PRML is its largely increased complexity (+167%) compared to a 3-taps PRML.

TABLE 1

Number of states ($N_S$) and number of branches ($N_B$) of the Finite-State-Machine (FSM) as a function of the number of taps of the PRML detector.

| number of taps | $N_S$ | $N_B$ |
|---|---|---|
| 3 | 6 | 10 |
| 4 | 10 | 16 |
| 5-r.c. | 10 | 16 |
| 5 | 16 | 26 |

Figure 6:
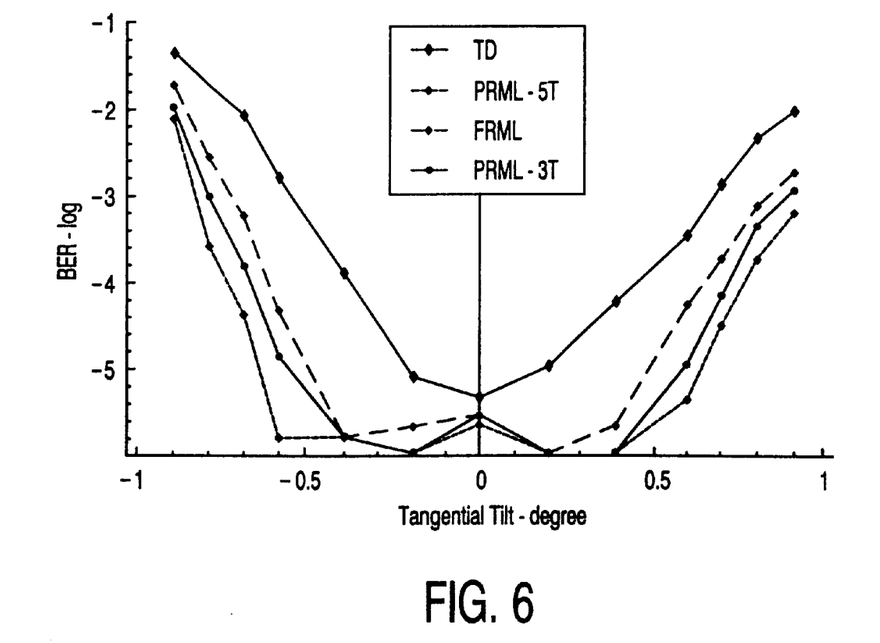
FIG. 6 shows the bit-error-rate (BER) as function of tangential disc tilt for phase-change land-groove recording in groove, for 3-taps and 5-taps PRML, for Full-Response ML (FRML), and for Threshold Detection (TD)

The finite state diagrams for the 3-taps and 5-taps PRML are shown in FIGS. 3 and 4, respectively. FIG. 6 compares the performance in terms of bit-error-rate (BER) for a d=1 experiment for phase-change recording. The gain between 3-taps and 5-taps is due to differentiation for the short runlengths, i.e. I2 and I3. In the case of the 3-taps PRML, the first bits (or the last bits) of an I2 and an I3 are related to the same state; this implies that the same reference amplitude level is used upon computing the likelihood. In the case of the 5-taps PRML, the runs I2 and I3 follow separate paths through the finite state diagram so that the difference in amplitude level can be accounted for. For the 5-taps PRML, additional states are present in the finite state diagram which are related to the longer runs from I4 onwards; the 5-taps states $(-1)(1)^4$ and $(1)^4(-1)$ on the positive bit-side (+1), and the states $(1)^4(1)$ and $(1)(-1)^4$ on the negative bit-side (-1) are visited for the runs I4 and larger, the states $(1)^5$ and $(-1)^5$ are visited for the runs I5 and larger. For the 3-taps PRML, all the runs longer than I3 pass through the states $(1)^3$ or $(-1)^3$.

Figure 7:
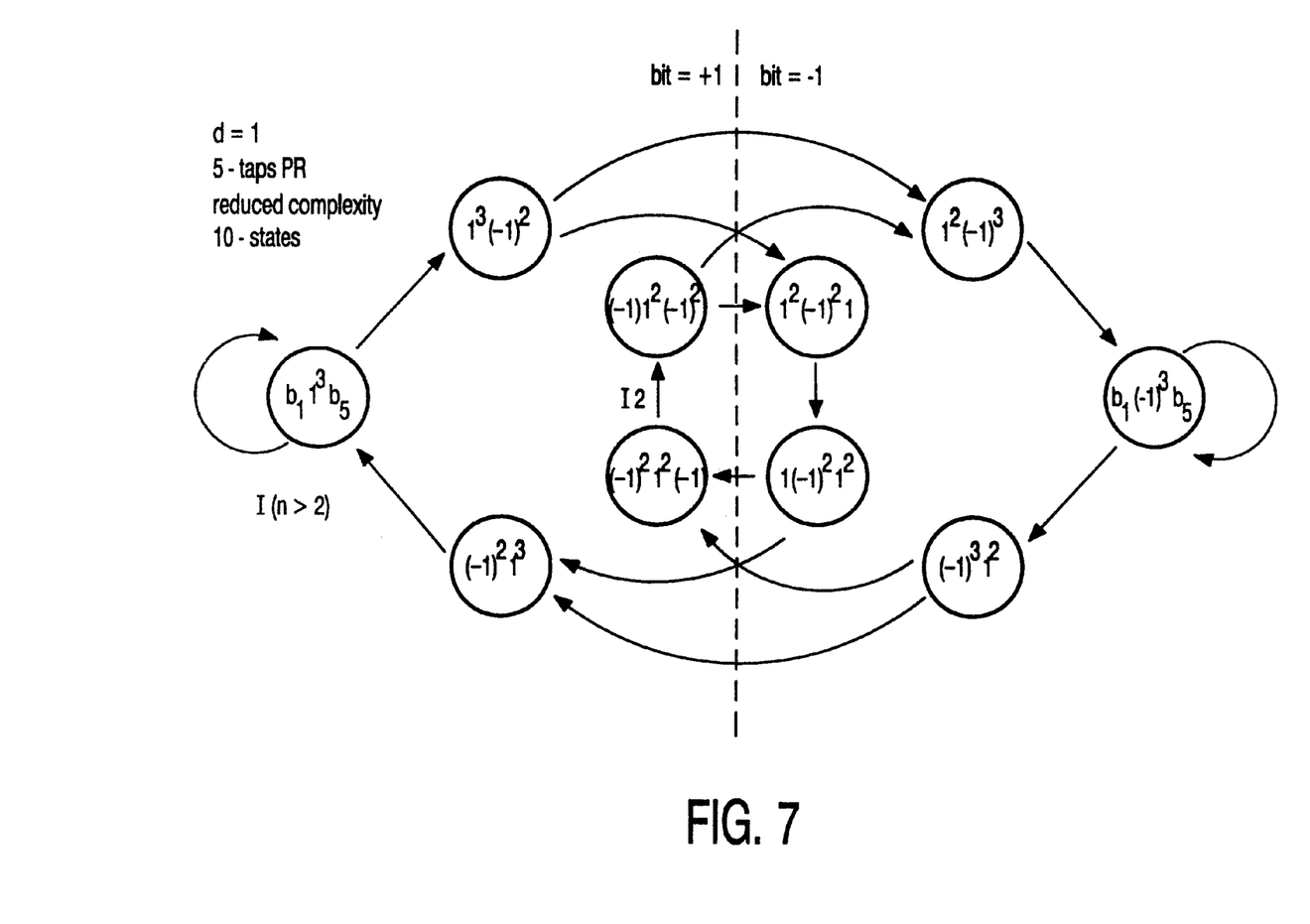
FIG. 7 shows a finite-state diagram of a 5-taps PRML state detector with reduced complexity for a d=1 channel code.
Figure 8:
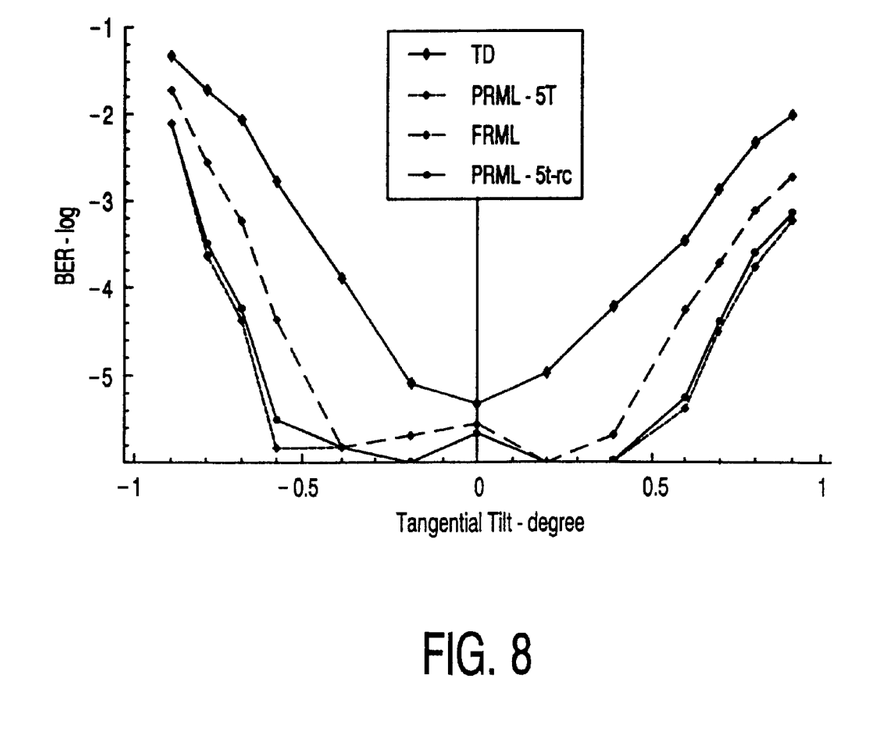
FIG. 8 shows the bit-error-rate (BER) as function of tangential disc tilt for phase-change recording in groove, for 5-taps and 5-taps reduced-complexity (r.c.) PRML, for Full-Response ML (FRML), and for Threshold Detection (TD)

The gain between 3-taps and 5-taps is not due to the differentiation on the amplitude levels for the outer bits of the longer runlengths so that the states $(-1)(1)^4$, $(1)^4(-1)$, $(1)^5$ and $(-1)(1)^3(-1)$ can be merged into a joint state $b_1(1)^3b_5$, with the first bit $b_1$ and the fifth bit $b_5$ can be either +1 or -1. The inner bits of a run are all the bits in the run, except the ones just next to a transition. In other words, for the inner bits of the longer runs (from I4 on), a 3-taps PRML might be sufficient. The merging of the 4 states into a single one (at both bit-sign sides) yields a reduced complexity in the finite state diagram, as shown in FIG. 7. The number of states now equals 10 instead of 16, as listed in Table 1. The performance of the 5-taps-r.c. (reduced complexity) detector is shown in FIG. 8; the performance loss compared to the full-fledged 5-taps detector is relatively small.

The main advantage of the 5-taps reduced complexity PRML is that it yields only a 67% increase in complexity compared to a 3-taps PRML, whereas the full-fledged 5-taps PRML requires an increase of 167% in complexity.

Figure 9:
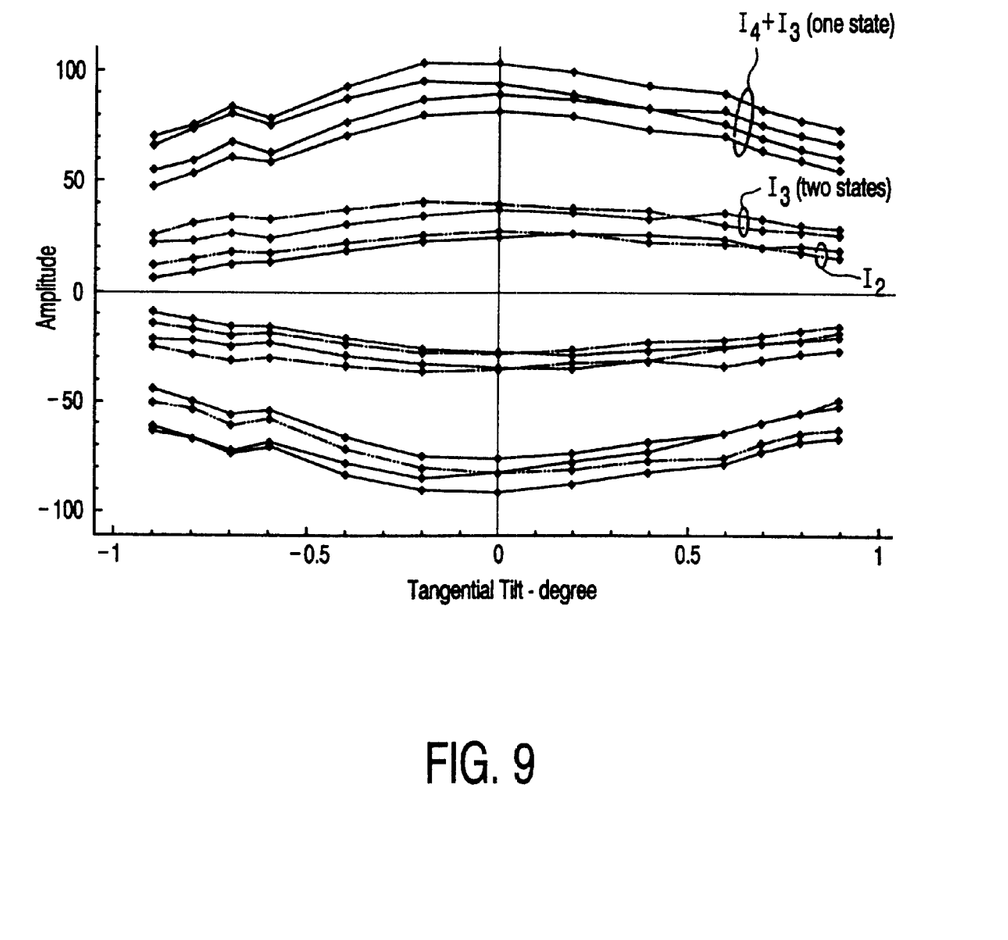
FIG. 9 shows the retrieved amplitudes for 5-taps PRML, as function of tangential tilt experiment on groove.

The amplitude levels retrieved in a phase-change optical recording experiment as a function of tangential tilt, are shown in FIG. 9 for a 5-taps PRML, using the linear averaging process described above. The reduction in states for the 5-taps reduced complexity PRML consists in reducing the 4 upper and 4 lower levels into only two separate levels (actually, the ones with lowest absolute value of the amplitude). Those are the levels of the states $1^5$, $1^4(-1)$, $(-1)1^4$ and $(-1)1^3$ (-1) in FIG. 4, identified in FIG. 7 by the state $b_1 1^3 b_5$, and the levels of the states $(-1)^5$, $1(-1)^4$, $(-1)^4 1$ and $1(-1)^3 1$ in FIG. 4, identified by the state $b_1(-1)^3 b_5$ in FIG. 7. The levels corresponding with the shorter runs I2, via the states $(-1)1^2(-1)^2$ and $(-1)^2 1^2$ in FIGS. 4 and 7, and I3, via states $1^3(-1)^2$ and $(-1)^2 1^3$ in FIGS. 4 and 7, are left intact.

Whilst the invention has been described with reference to preferred embodiments thereof, it is to be understood that these are not limitative examples. Thus, various modifications may become apparent to those skilled in the art, without departing from the scope of the invention, as defined by the claims.

Further, the invention lies in each and every novel feature or combination of features.

References (1) G. van den Enden, International Patent Application (PCT) filed under nr. IB97/01532, 1997.
(2) WO 97/29485

What is claimed is:
1. Partial response maximum likelihood (PRML) bit detection apparatus, comprising:
   input means for receiving an input information signal; conversion means for deriving a digital signal from the input information signal, the digital signal including an array of bits of a first or a second binary value occurring at bit instants with a specified bit frequency;
   detection means for repeatedly detecting a state from subsequent sequences of n subsequent bits in the digital signal, the subsequent sequences being obtained by shifting a time window of n subsequent bits each time over one bit in time;
   sample value determining means for deriving sample values from the input information signal, one sample value for each of the sequences of n bits, the one sample value for a sequence of n bits corresponding to the signal value of the input information signal at a predetermined time instant lying within a time window corresponding to the sequence of n bits;
   processing means for processing the sample values belonging to sequences of n bits of the same state, and for carrying out this processing step for all states, so as to obtain a processed signal value for each state;
   output means for supplying the processed signal values for each state as amplitude values;
   means to use the amplitude values for the possible states, obtained from a first portion of the input information signal, for detecting bits from a second portion of the input information signal;
   error detection means for detecting errors in the bits obtained from bit detection on the second portion of the input information signal by the means to use the amplitude values for the possible states; and
   means to reject the amplitude values for the possible states, obtained from the first portion of the input information signal in response to the error detection means identifying for the bits obtained from the second portion of the input information signal that it includes an error.

* * * * *